US010849259B2

(12) United States Patent
Tsuri

(10) Patent No.: US 10,849,259 B2
(45) Date of Patent: Nov. 24, 2020

(54) MOUNTING HEAD AND SURFACE MOUNTER

(71) Applicant: Yamaha Hatsudoki Kabushiki Kaisha, Iwata (JP)

(72) Inventor: Kenji Tsuri, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 266 days.

(21) Appl. No.: 15/762,412

(22) PCT Filed: Oct. 1, 2015

(86) PCT No.: PCT/JP2015/077948
§ 371 (c)(1),
(2) Date: Mar. 22, 2018

(87) PCT Pub. No.: WO2017/056293
PCT Pub. Date: Apr. 6, 2017

(65) Prior Publication Data
US 2018/0263149 A1 Sep. 13, 2018

(51) Int. Cl.
*H05K 13/04* (2006.01)
*H05K 13/00* (2006.01)
*H05K 13/02* (2006.01)

(52) U.S. Cl.
CPC ......... *H05K 13/0408* (2013.01); *H05K 13/04* (2013.01); *H05K 13/046* (2013.01); *H05K 13/0061* (2013.01); *H05K 13/02* (2013.01)

(58) Field of Classification Search
CPC ..... H05K 13/04; H05K 13/041; H01R 43/205
See application file for complete search history.

(56) References Cited

U.S. PATENT DOCUMENTS 5,579,572 A * 12/1996 Kashiwagi ........... H05K 13/041
29/836
6,101,707 A * 8/2000 Kano ................. H05K 13/0409
29/740

(Continued)

FOREIGN PATENT DOCUMENTS

CN 1777357 A 5/2006
CN 102638964 A 8/2012

(Continued)

OTHER PUBLICATIONS

An Office Action issued by the Chinese Patent Office dated Jul. 24, 2019, which corresponds to Chinese Patent Application No. 201580083221.2 and is related to U.S. Appl. No. 15/762,412; with English language translation.

(Continued)

*Primary Examiner* — Minh N Trinh
(74) *Attorney, Agent, or Firm* — Studebaker & Brackett PC

(57) ABSTRACT

A mounting head includes a pickup nozzle, a shaft member, a drive unit, and a position retainer. The shaft member has a cylindrical shape and moves in an axial direction to switch a pressure applied to the pickup nozzle between negative and positive pressures. First and second movement ends in the axial direction are negative and positive pressure application positions, respectively, where negative and positive pressure, respectively, is applied to the pickup nozzle. The drive unit includes a drive source that moves a movable portion in the axial direction. The movable portion contacts the shaft member when moved in the axial direction, to move the shaft member between the negative and positive pressure application positions. During a power-off period of the drive source, the position retainer holds the movable portion in a predetermined position away from the shaft (Continued)

member located at the negative or positive pressure application positions.

12 Claims, 10 Drawing Sheets

(56) References Cited

U.S. PATENT DOCUMENTS

| | | | | |
|---|---|---|---|---|
| 7,100,278 | B2* | 9/2006 | Hata | H05K 13/041 |
| | | | | 29/834 |
| 8,240,028 | B2* | 8/2012 | Kanai | H05K 13/0413 |
| | | | | 29/739 |
| 2018/0263149 | A1* | 9/2018 | Tsuri | H05K 13/0408 |

FOREIGN PATENT DOCUMENTS

| CN | 103298330 A | 9/2013 |
|---|---|---|
| CN | 103828503 A | 5/2014 |
| CN | 104641736 A | 5/2015 |
| JP | H11-040989 A | 2/1999 |
| JP | 2001-300881 A | 10/2001 |
| JP | 4289761 B2 | 7/2009 |
| JP | 2013-069798 A | 4/2013 |
| JP | 2013-179117 A | 9/2013 |

OTHER PUBLICATIONS

An Office Action; "Decision of Refusal," issued by the Japanese Patent Office dated Apr. 9, 2019, which corresponds to Japanese Patent Application No. 2017-542640 and is related to U.S. Appl. No. 15/762,412.

International Search Report issued in PCT/JP2015/077948; dated Jan. 12, 2016.

An Office Action mailed by the Japanese Patent Office dated Oct. 9, 2018, which corresponds to Japanese Patent Application No. 2017-542640 and is related to U.S. Appl. No. 15/762,412.

* cited by examiner

MOUNTING HEAD AND SURFACE MOUNTER

CROSS-REFERENCE TO RELATED APPLICATION

This application is a National Stage of International Patent Application No. PCT/JP2015/077948, filed Oct. 1, 2015, the entire content of which is incorporated herein by reference.

BACKGROUND

Technical Field

The technology disclosed herein relates to a mounting head and a surface mounter.

Background Art

A mounting head has been widely used in a surface mounter configured to mount electronic components on a printed substrate. The mounting head includes a plurality of pickup nozzles configured to hold a component at the front end by means of a negative pressure and configured to release the component held at the front end by means of a positive pressure. In some mounting heads of this type, a mechanical valve structure may be provided near the pickup nozzle such that the pressure applied to the pickup nozzle is switched between the negative pressure and the positive pressure. Japanese Unexamined Patent Application Publication No. 2013-69798, for example, discloses a placement head, which is a mounting head including such a mechanical valve structure.

The mechanical valve of the placement head disclosed in Japanese Unexamined Patent Application Publication No. 2013-69798 includes cylindrical valve spools and a switching member drive unit, which is configured to move the valve spool located at a predetermined position up and down in the axial direction of the valve spool. In the placement head, the valve spool is moved up and down in the axial direction to switch the pressure applied to the pickup nozzle, which corresponds to the valve spool, between a negative pressure and a positive pressure. In this placement head, the upward movement end of the valve spool is a negative pressure application position where a negative pressure is applied to the pickup nozzle, the downward movement end of the valve spool is a positive pressure application position where a negative pressure is applied to the pickup nozzle.

The switching member drive unit is configured to be driven by a rotary motor. The switching member extending from the output shaft moves in an arc-like shape when brought into contact with a portion of the valve spool located at a predetermined position. Thus, the switching member pushes the valve spool up or down to move the valve spool in the up-down direction. The placement head is a rotary type placement head. The valve spools and the pickup nozzles are circled when the placement head is rotated about the shaft, changing the valve spool to be moved in the up-down direction by the switching member drive unit.

SUMMARY

However, in the placement head disclosed in Japanese Unexamined Patent Application Publication No. 2013-69798, when the switching member drive unit is powered off, a force for driving the switching member is not supplied. This may cause the switching member to drop due to its own weight, and a portion of the switching member may come in contact with the valve spool. Thus, the placement head cannot be rotated during maintenance of the mounting head, and obstacles to the maintenance operation need to be manually removed, lowering the maintenance properties.

In addition, when the switching member drive unit is powered off and the switching member drops, the valve spool may be moved from the negative pressure application position to the positive pressure application position by the switching member drive unit. Thus, if the pickup nozzle corresponding to the valve spool is holding a component, the component drops from the pickup nozzle due to the application of the positive pressure to the pickup nozzle, reducing device reliability.

The technology disclosed herein is made in the view of the above-described problem, and an object is to improve maintenance properties and device reliability.

The technology disclosed herein relates to a mounting head including a pickup nozzle configured to hold a component by suction at a front end thereof by means of a negative pressure and release the component held at the front end by means of a positive pressure, and a shaft member having a cylindrical shape and configured to move in an axial direction thereof to switch a pressure applied to the pickup nozzle between the negative pressure and the positive pressure. The mounting head further includes a drive unit including a drive source and a movable portion configured to move in the axial direction by using power supplied from the drive source, and a position retainer configured to hold the movable portion in a predetermined position during a power-off period of the drive source such that the movable portion is away from the shaft member located at any of the negative pressure application position and the positive pressure application position. A first movement end of the shaft member in the axial direction is a negative pressure application position where the negative pressure is applied to the pickup nozzle, and a second movement end in the axial direction is a positive pressure application position where the positive pressure is applied to the pickup nozzle. The movable portion is configured to come in contact with the shaft member at a portion thereof when moved in the axial direction, allowing the shaft member to move between the negative pressure application position and the positive pressure application position.

In the mounting head having the above-described configuration, when the drive source is stopped by being powered off, for example, the position retainer holds the movable portion in a predetermined position so as to be away from the shaft member located at any of the negative pressure application position and the positive pressure application position. Thus, the movable portion does not come in contact with the shaft member located at any of the negative pressure application position and the positive pressure application position when the mounting head is rotated for maintenance. This improves the maintenance properties of the mounting head.

Furthermore, in the above-described mounting head, the position retainer holds the movable portion such that the movable portion does not come in contact with the shaft member located at any of the negative pressure application position and the positive pressure application position. With this configuration, when the mounting head is stopped suddenly by being powered off, for example, with the pickup nozzle holding a component, the movable portion is unlikely to come in contact with the shaft member and switch the position of the shaft member from the negative pressure application position to the positive pressure application position. Thus, the component is less likely to drop from the pickup nozzle. This improves device reliability. As described above, the above-described mounting head has improved maintenance properties and improved device reliability.

In the above-described mounting head, the movable portion may include a pin configured to come in contact with a contact portion of the shaft member, and the position retainer may hold the movable portion such that the pin is positioned between the contact portion of the shaft member located at the negative pressure application position and the contact portion of the shaft member located at the positive pressure application position.

In this configuration, since the pin is held at a position between the contact portion of the shaft member located at the negative pressure application position and the contact portion of the shaft member located at the positive pressure application position, the pin does not come in contact with the contact portion. The pin is preferably held at a middle between the contact portions. With this configuration, the pin is less likely to come in contact with each of the contact portions of the shaft member located at any of the negative pressure application position and the positive pressure application position.

In the mounting head, the position retainer may be composed of a magnetic spring including a magnetic body and a magnet.

For example, if the position retainer is composed of a spiral spring, such as a coil spring, it would be difficult to adjust the retaining position of the movable portion. In addition, since the elasticity of the spiral spring deteriorates, the retaining force may be lowered. In contrast to this, the magnetic spring is able to adjust the retaining position of the movable portion by adjustment of the location of the magnetic body, such as an iron piece. Thus, the magnetic spring is able to hold the movable portion with high positional accuracy, and the magnetic spring is less likely to deteriorate and has higher durability than the spiral spring.

In the above-described mounting head, the drive unit may include a stator, the movable portion may include a mover, and the movable portion may be moved by a linear motor including the stator and the mover. The mover may include a plurality of magnets arranged in a straight line at an equal interval. A distance between the magnet included in the position retainer and the magnets included in the mover may be larger than a distance between the magnets included in the mover.

With this configuration, the magnetic body included in the position retainer is less likely to affect the magnets included in the mover, compared with the configuration in which the distance between the magnet included in the position retainer and the magnet included in the mover is smaller than or equal to the distance between the magnets included in the mover. Thus, the magnets included in the mover are less likely to be drawn to the magnetic body included in the position retainer. This allows the position retainer to be composed of the magnetic spring and also allows the movable portion to be reliably moved by a linear motor.

Another technology disclosed herein relates to a surface mounter including a component mounting device including the above-described mounting head and configured to mount a component on a substrate, a component feeding device configured to feed the component to the component mounting device, and a substrate transferring device configured to transfer the substrate to a mounting region where the component is mounted by the component mounting device.

The technology disclosed herein improves maintenance properties and device reliability.

DETAILED DESCRIPTION (Overall Configuration of Surface Mounter)

Figure 1:
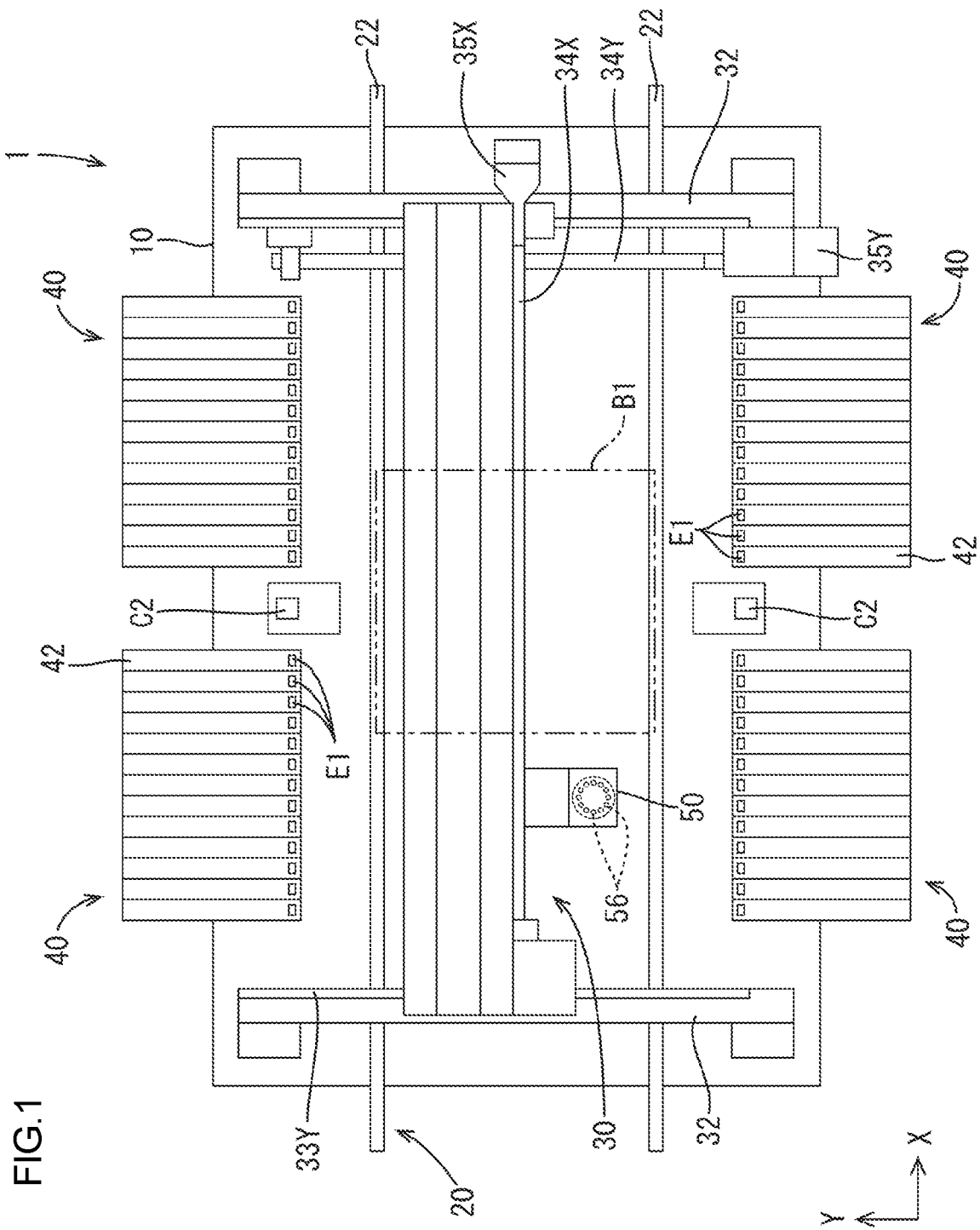
FIG. 1 is a plan view of a surface mounter.

An embodiment is described with reference to the drawings. In this embodiment, a surface mounter 1 illustrated in FIG. 1 is described as an example. The surface mounter 1 includes a base 10, a transfer conveyor (one example of a substrate transferring device) 20 configured to transfer a printed substrate (one example of a substrate) B1, a component mounting device 30 configured to mount an electronic component (one example of a component) E1 on the printed substrate B1, and a component feeding device 40 configured to feed the electronic component E1 to the component mounting device 30.

The base 10 has an oblong shape in plan view and has a flat upper surface. A backup plate (not illustrated) or the like for supporting the printed substrate B1 during mounting of the electronic component E1 on the printed substrate B1 is provided below the transfer conveyor 20 on the base 10. In the following description, the longitudinal direction of the base 10 (the left-right direction in FIG. 1) and the transfer direction of the transfer conveyor 20 are referred to as an X-axis direction. The width direction of the base 10 (the up-down direction in FIG. 1) is referred to as a Y-axis direction. The up-down direction of the base 10 (the up-down direction in FIG. 2) is referred to as a Z-axis direction.

The transfer conveyor 20 is located at the substantially middle of the base 10 in the Y-axis direction and is configured to transfer the printed substrate B1 in the transfer direction (the X-axis direction). The transfer conveyor 20 includes a pair of conveyor belts 22 configured to circulate in the transfer direction. The printed substrate B1 is positioned across the conveyor belts 22. The printed substrate B1 is transferred from one side in the transfer direction (the right side in FIG. 1) along the conveyor belt 22 to an operation position (an area surrounded by a two-dot chain line) on the base 10 where the printed substrate B1 is stopped for the mounting operation of the electronic component E1. Then, the printed substrate B1 is transferred to the other side (the left side in FIG. 1) along the conveyor belt 22 and discharged.

Two component feeding devices 40, which are feeder-type component feeding devices, are arranged side by side in the X-axis direction on each side of the transfer conveyor 20 (each side in the up-down direction in FIG. 1), i.e., the total of four component feeding devices 40. The component feeding devices 40 each include a plurality of feeders 42 arranged side by side. The feeders 42 each include a reel (not illustrated), around which a component feeding tape (not illustrated) holding the electronic components E1 is wound, and an electric unwinding device (not illustrated), which is configured to unwind the component feeding tape from the reel, for example. In the feeder 42, the electronic components E1 are fed one by one from a component feeding position located at the end adjacent to the transfer conveyor 20.

The component mounting device 30 includes a pair of supporting frames 32, which is positioned above the base 10 and the component feeding devices 40 described later, a mounting head 50, which is a rotary type mounting head, and a mounting head drive mechanism configured to drive the mounting head 50. The supporting frames 32 extending in the Y-axis direction are positioned at the both sides of the base 10 in the X-axis direction. The supporting frames 32 are provided with an X-axis servomechanism and a Y-axis servomechanism, which constitute the mounting head drive mechanism. The mounting head 50 is movable in the X-axis direction and the Y-axis direction over a predetermined motion region by using the X-axis servomechanism and the Y-axis servomechanism.

The Y-axis servomechanism includes Y-axis guide rails 33Y, Y-axis ball screws 34Y on each of which a ball nut (not illustrated) is threadably mounted, and a Y-axis servomotor 35Y. A head support 36 fixed to a ball nut is attached to each Y-axis guide rail 33Y. The ball nut is moved forward or backward along the Y-axis ball screw 34Y when the Y-axis servomotor 35Y is energized. This moves the head support 36 fixed to the ball nut and the mounting head 50, which will be described later, in the Y-axis direction along the Y-axis guide rail 33Y.

The X-axis servomechanism includes an X-axis guide rail (not illustrated), an X-axis ball screw 34X on which a ball nut (not illustrated) is threadably mounted, and an X-axis servomotor 35X. The mounting head 50 is attached to the X-axis guide rail in a movable manner in the axial direction of the X-axis guide rail. The ball nut is moved forward or backward along the X-axis ball screw 34X when the X-axis servomotor 35X is energized. This moves the mounting head 50 fixed to the ball nut in the X-axis direction along the X-axis guide rail 33X.

(Configuration of Mounting Head)

Figure 2:
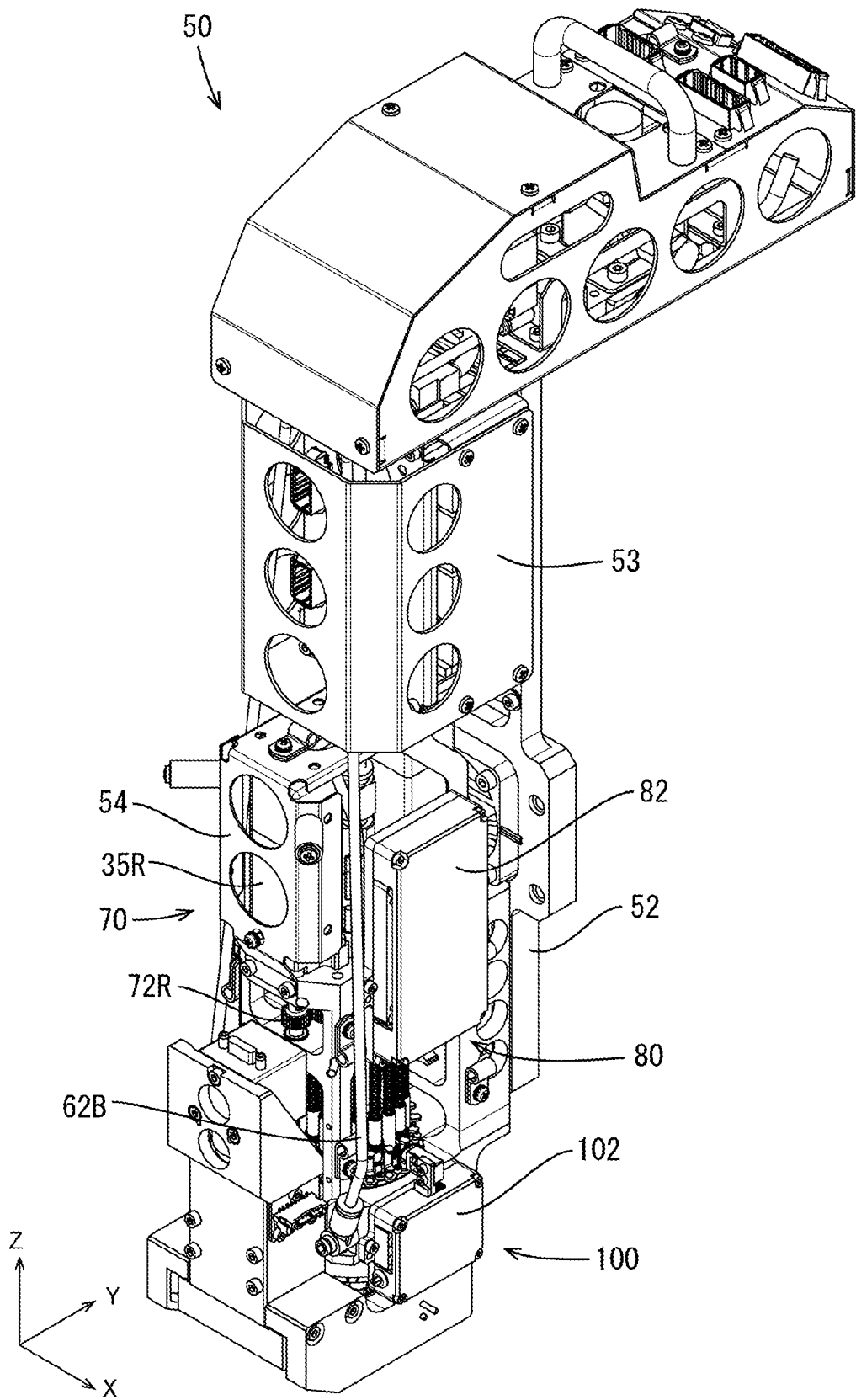
FIG. 2 is a perspective view of a mounting head.

Next, the configuration of the mounting head 50 is described in detail. As illustrated in FIG. 2, the mounting head 50 includes an arm-like shaped head body 52 covered by covers 53 and 54. The mounting head 50 is configured to hold the electronic component E1 fed by the component feeding device 40 by suction and mount the electronic component E1 on the printed substrate B1. The mounting head 50 in this embodiment is a rotary type mounting head and includes eighteen nozzle shafts 55, which are held by a rotary body 60 in a movable manner in the Z-axis direction (the up-down direction), at the front-end portion (see FIG. 4).

Figure 4:
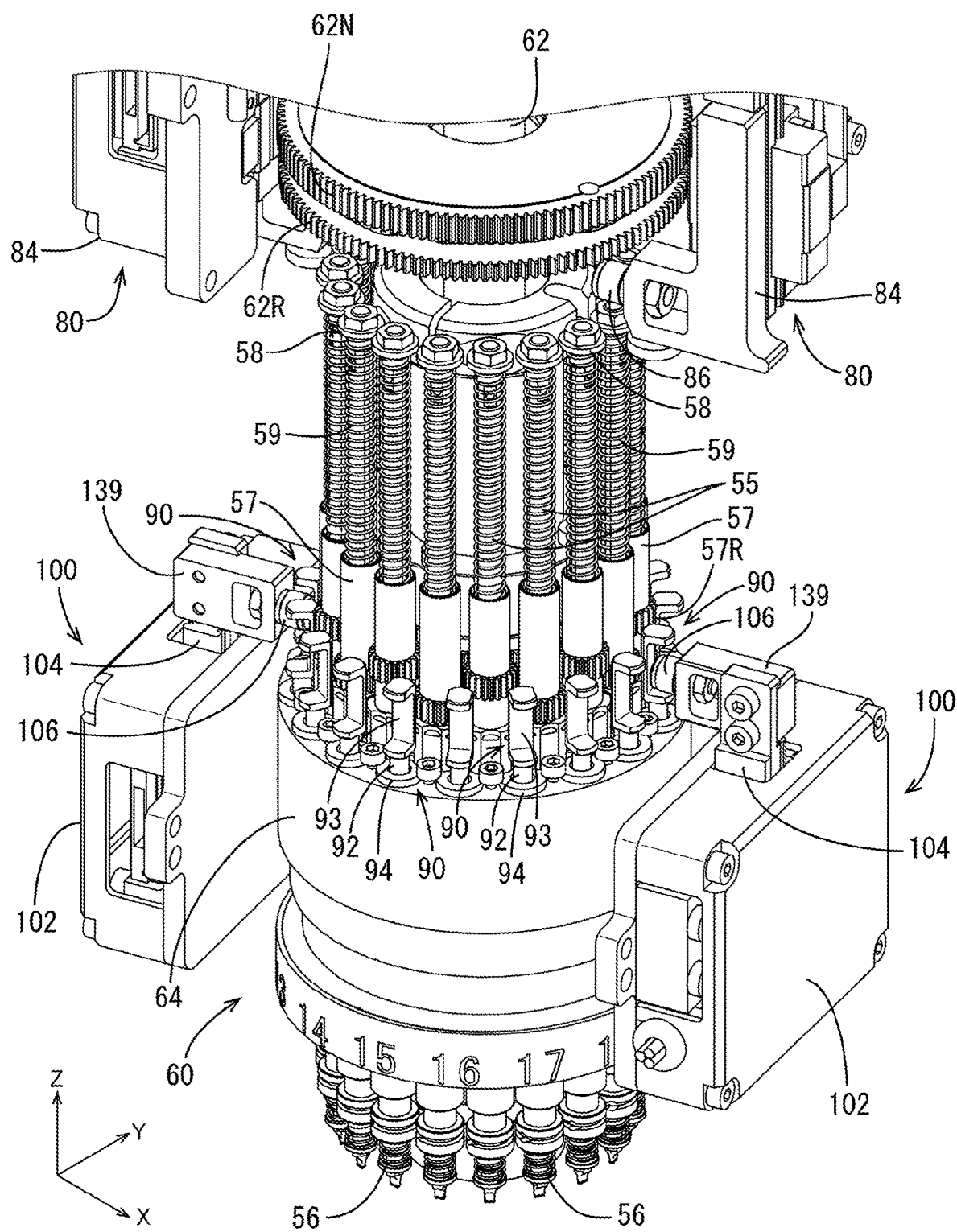
FIG. 4 is a perspective view corresponding to FIG. 3 and illustrating front-end portions of pickup nozzles in an exposed manner.

As illustrated in FIG. 4, the rotary body 60 includes a shaft 62 having a cylindrical shape extending in the Z-axis direction and a shaft retainer 64 disposed around the shaft 62 at a lower end of the mounting head 50. The shaft retainer 64 has a substantially cylindrical shape larger in diameter than the shaft 62. The shaft 62 of the rotary body 60 is supported by the head body 52 in a rotatable manner about the axis of the shaft 62. The shaft 62 has a two-layered structure. An N-axis driven gear 62N is provided coaxially with the shaft 62 at an upper portion of the inner shaft 62, and an R-axis driven gear 62R is provided coaxially with the shaft 62 at an upper portion of the outer shaft 62 (see FIG. 4).

An N-axis drive unit (not illustrated) configured to rotate the rotary body 60 is disposed at the substantially middle in the Z-axis direction of the mounting head 50. The N-axis drive unit includes an N-axis servomotor 35N (see FIG. 7) and an N-axis driving gear (not illustrated) disposed around the output shaft of the N-axis servomotor 35N. The N-axis driving gear and the N-axis driven gear 62N are engaged together. When the N-axis servomotor 35N is energized, the rotary body 60 is rotated by a predetermined angle about the axis extending in the Z-axis direction by the rotation of the N-axis driving gear and the N-axis driven gear 62N.

Figure 5:
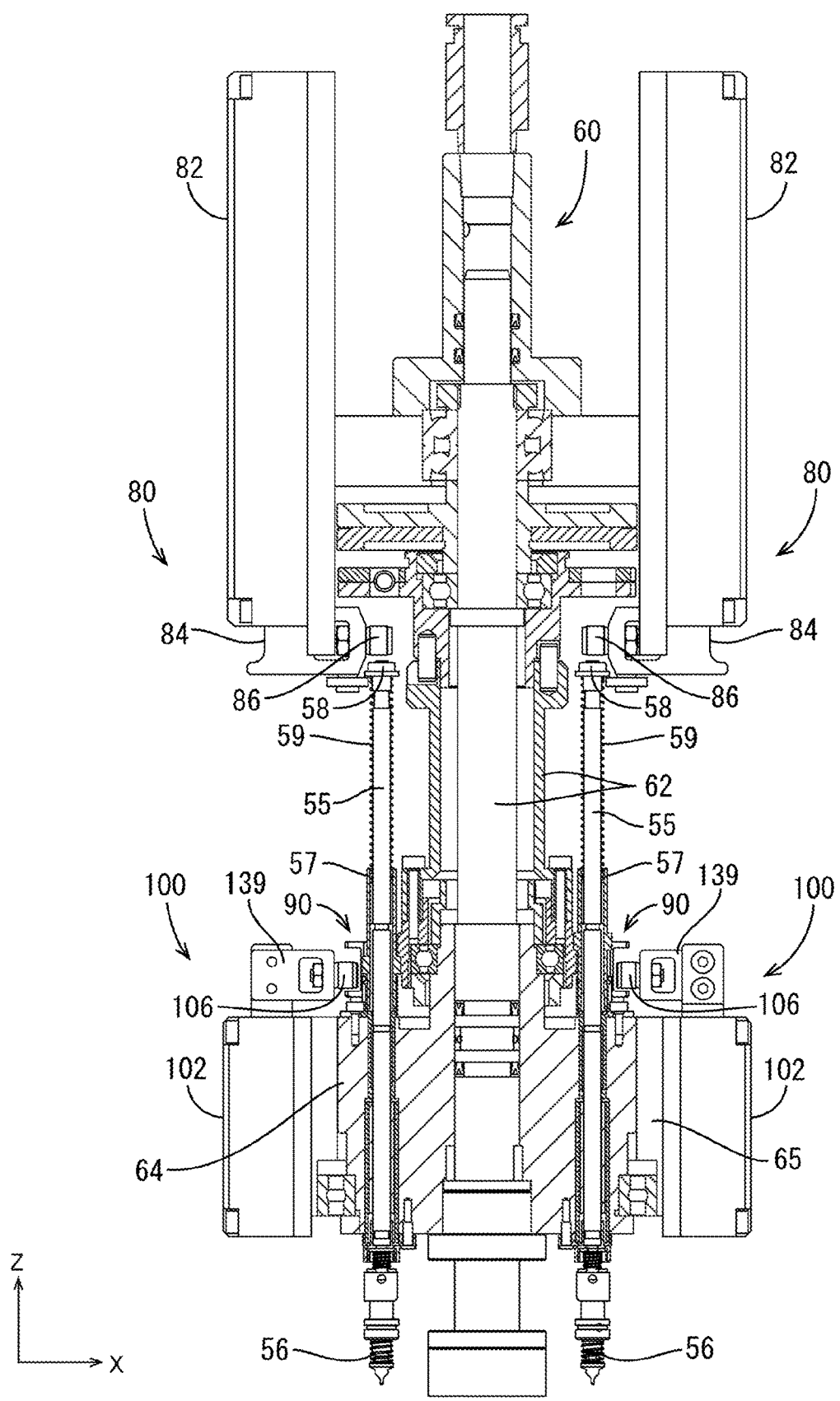
FIG. 5 is a cross-sectional view of main components of the mounting head.

The shaft retainer 64 of the rotary body 60 has eighteen through holes at an equal interval in the circumferential direction. Nozzle shafts 55 each having a cylindrical shape are held in the through holes to extend in the Z-axis direction through the shaft retainer 64. The nozzle shafts 55 pass through tubular shaft holders 57. As illustrated in FIG. 4 and FIG. 5, pickup nozzles 56 configured to hold the electronic components E1 by suction are provided at lower end portions of the nozzle shafts 55 protruding downward from the shaft retainer 64.

The pickup nozzles 56 are each configured to receive a negative pressure or a positive pressure. The pickup nozzles 56 are each configured to hold the electronic component E1 by suction at the front end by means of a negative pressure and to release the electronic component E1 held at the front end by means of a positive pressure. When the rotary body 60 is rotated by the N-axis drive unit, the pickup nozzles 56 provided at the nozzle shafts 55 are circled together with the nozzle shafts 55 about the axis of the rotary body 60.

As illustrated in FIG. 2, an R-axis drive unit 70 configured to rotate the nozzle shafts 55 about the respective axes is disposed at the substantially middle in the Z-axis direction of the mounting head 50. The R-axis drive unit 70 includes an R-axis servomotor 35R and an R-axis driving gear 72R (see FIG. 3) disposed around the output shaft of the R-axis servomotor 35R and engaged with the R-axis driven gear 62R. A common gear (not illustrated) is disposed on the outer shaft 62, on which the R-axis driven gear 62R is disposed, at a position below the R-axis driven gear 62R.

As illustrated in FIG. 4, nozzle gears 57R are disposed on the outer circumferences of the shaft holders 57. The nozzle gears 57R on the shaft holders 57 are engaged with the above-described common gear. When the R-axis servomotor 35R is energized, the common gear is rotated by the rotation of the R-axis driving gear 72R and the R-axis driven gear 62R. The rotation of the common gear rotates the shaft holders 57 due to the engagement with the nozzle gears 57R. The shaft holders 57 are connected to the corresponding nozzle shafts 55 through a ball spline mechanism, and thus the rotation of the common gear rotates the eighteen nozzle shafts 55 about the respective axes by the same angle in the same direction at the same time.

Spring retaining bolts 58 are threadably engaged with the upper ends of the nozzle shafts 55. A spiral spring 59 is disposed around the outer surface of each nozzle shaft 55. The spiral spring 59 is compressed between the spring retaining bolt 58 and the shaft holder 57. The nozzle shaft 55 is biased upward by an elastic force of the spiral spring 59.

Figure 3:
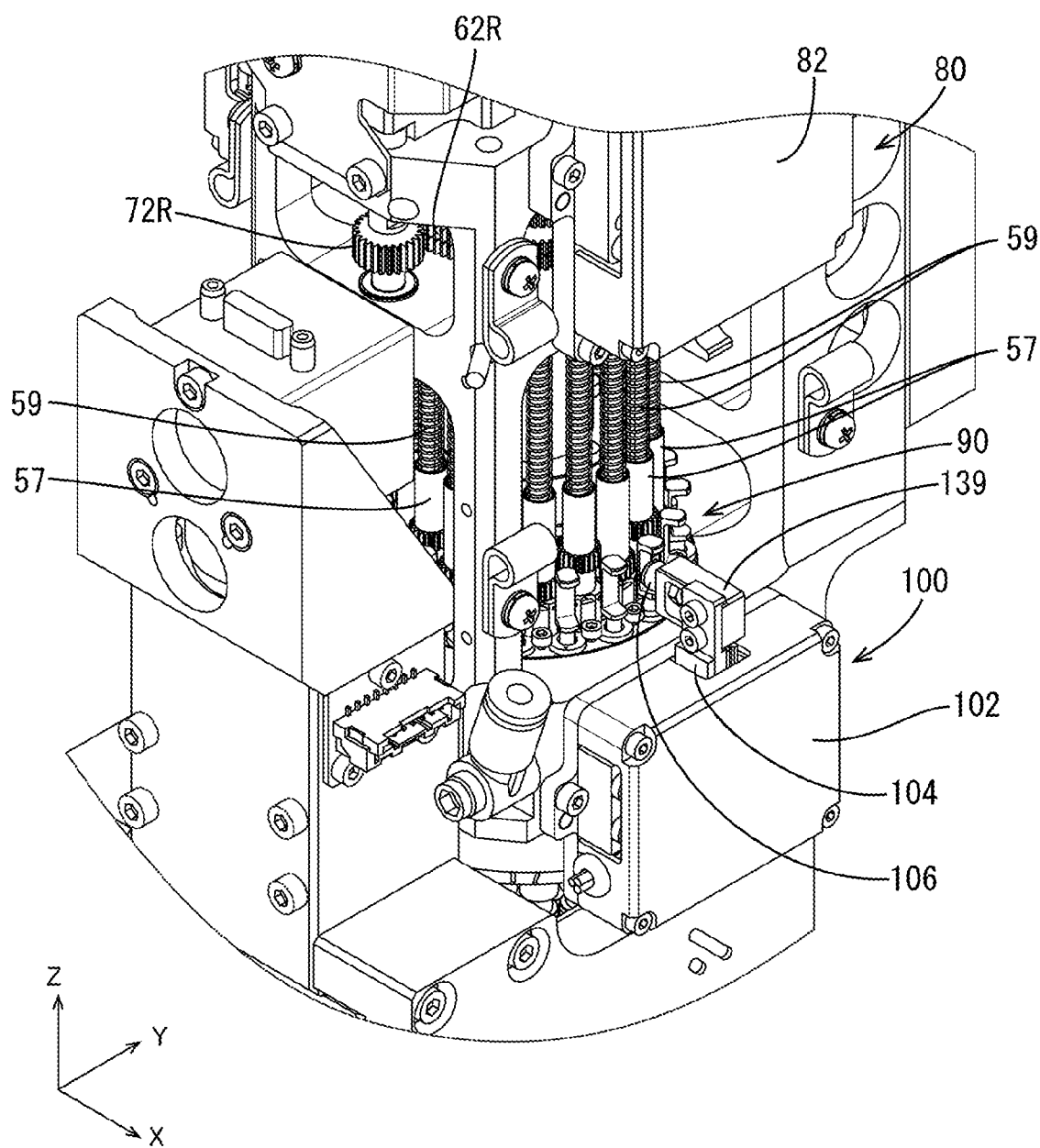
FIG. 3 is a magnified perspective view of a portion of the mounting head.

As illustrated in FIG. 2 to FIG. 4, the mounting head 50 includes two Z-axis drive units 80 configured to move up and down the nozzle shafts 55 at predetermined positions of the eighteen nozzle shafts 55 relative to the rotary body 60 along the shaft 62 of the rotary body 60 (in the z-axis direction or the up-down direction). The Z-axis drive units 80 are symmetrically arranged above the nozzle shafts 55 (see FIG. 5) at the left and right sides of the mounting head 50 with the shaft 62 of the rotary body 60 therebetween.

As illustrated in FIG. 3 to FIG. 5, the Z-axis drive units 80 each include a Z-axis drive source 82 having a box-like shape and a Z-axis movable portion 84 configured to move in the Z-axis direction (the up-down direction) by using power from the Z-axis drive source 82. The Z-axis drive source 82 includes a Z-axis linear motor 35Z (see FIG. 7) configured to drive the Z-axis movable portion 84 by a linear motor.

As illustrated in FIG. 4 and FIG. 5, a cam follower 86 (hereinafter, referred to as a "Z-axis cam follower 86") is attached to the lower end of the Z-axis movable portion 84 of the Z-axis drive unit 80 in a rotatable manner about the axis extending in the X-axis direction. The Z-axis movable portion 84 that has been moved up to the upward movement end is held by the Z-axis drive source 82 in such a manner that the Z-axis cam follower 86 is located near the upper end of the nozzle shaft 55 (the spring retaining bolt 58) that is located at a predetermined position (see FIG. 5). When the Z-axis movable portion 84 is positioned at the upward movement end, the nozzle shafts 55 are able to circle around the shaft 62.

When the Z-axis movable portion 84 at the upward movement end is moved down by the Z-axis drive source 82, the Z-axis cam follower 86 comes in contact with the upper end of the nozzle shaft 55 that is located at the predetermined position, and the nozzle shaft 55 is moved down against the elastic force of the spiral spring 59. When the nozzle shaft 55 is moved down, the pickup nozzle 56 attached to the nozzle shaft 55 is moved down such that the front end of the pickup nozzle 56 is located close to the printed substrate B1 positioned at a component supply position or an operation position of the component feeding device 40. When the Z-axis movable portion 84 in this state is moved up, the nozzle shaft 55 and the pickup nozzle 56 are moved up by an elastic restoring force of the spiral spring 59.

As illustrated in FIG. 4 and FIG. 5, the mounting head 50 further includes switching devices 90 configured to switch the pressure applied to the pickup nozzles 56 between a negative pressure and a positive pressure. Eighteen switching devices 90 are provided so as to correspond to the pickup nozzles 56 (the nozzle shafts 55). The switching devices 90 are disposed outwardly of the nozzle shafts 55, which are arranged in a circular shape, at positions between adjacent nozzle shafts 55. The switching devices 90 are arranged in a circular shape along the outer circumference of the shaft retainer 64 at an equal interval (see FIG. 4) as the nozzle shafts 55.

As illustrated in FIG. 4 and FIG. 5, the switching devices 90 each include a valve spool (one example of a shaft member) 92 and a sleeve (one example of a housing member) 94 housing the lower portion of the valve spool 92. The sleeves 94 are attached to respective mounting holes in the shaft retainer 64. Specifically described, the whole sleeve 94 except a large-diameter portion 98 at the top is inserted into the mounting hole. The lower portion of the valve spool 92 (most of the valve spool 92 other than a contact portion 93) is housed in the sleeve 94 through the upper opening exposed at the shaft retainer 64 in a movable manner in the axial direction.

The valve spools 92 are disposed with the axial direction thereof being oriented in the Z-axis direction (the up-down direction). The valve spools 92 moved in the axial direction switch the pressure applied to the pickup nozzles 56 between a negative pressure and a positive pressure.

Figure 6:
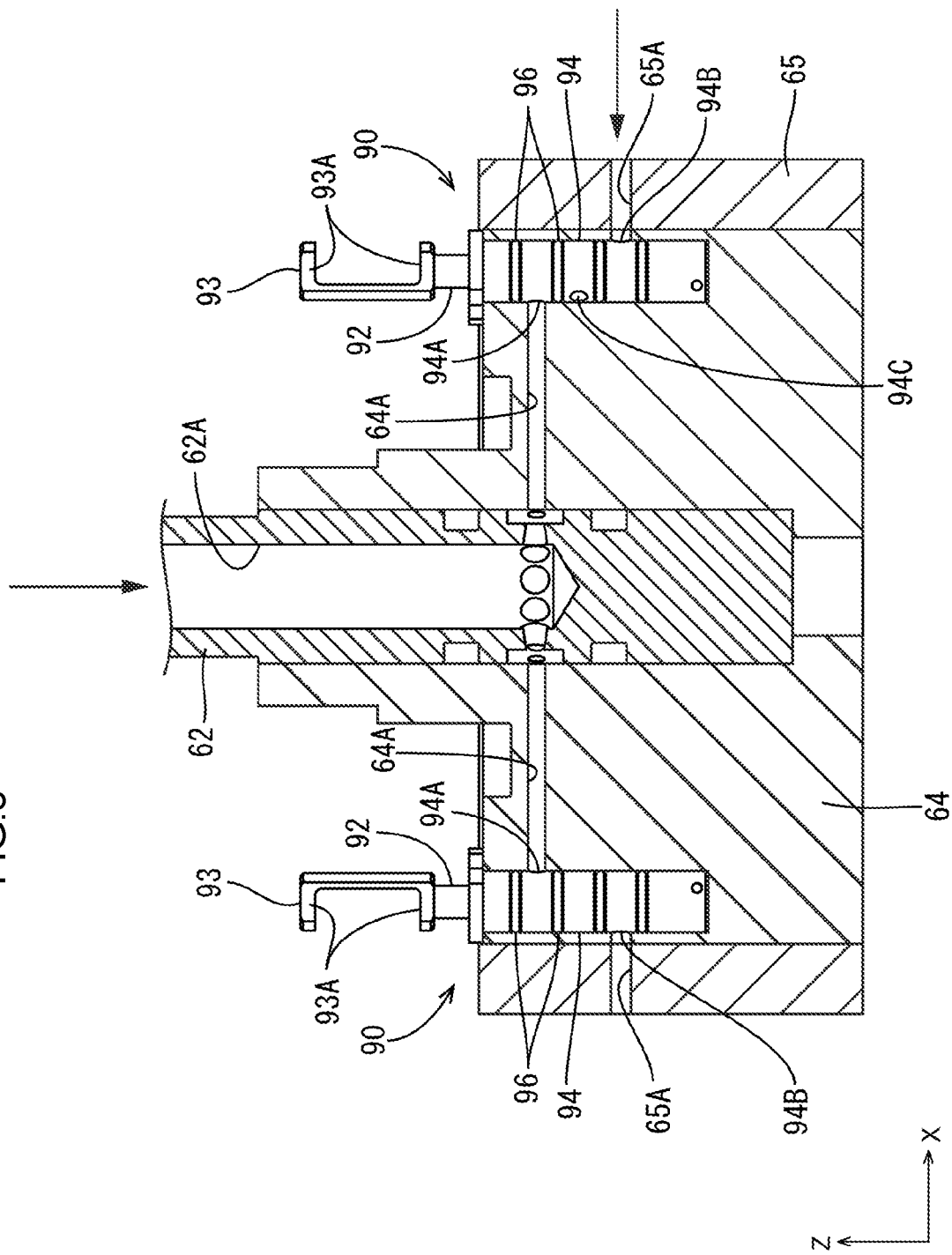
FIG. 6 is a cross-sectional view illustrating a portion of a front-end portion (a lower end portion) of the mounting head. In the cross-sectional view, a valve spool is positioned at a positive pressure application position.

As illustrated in FIG. 5 and FIG. 6, the valve spools 92 each have a contact portion 93 having a laterally facing U-like shape at the upper portion. The contact portion 93 has two opposing portions 93A extending in a direction perpendicular to the axial direction of the valve spool 92 (the Z-axis direction) and facing each other with a space therebetween in the axial direction (the Z-axis direction) and a connection portion 93B connecting the opposing portions 93A (see FIG. 6). The contact portion 93 protrudes upward from the sleeve 94. The valve spools 92 are each arranged such that the opening of the U-like shaped contact portion 93 faces to the outer side (the side opposite the shaft 62) (see FIG. 4).

In the switching device 90, the valve spool 92 in the sleeve 94 is moved to the upward movement end (hereinafter referred to as a "negative pressure application position"), which is indicated by a two-dot chain line in FIG. 8 to apply a negative pressure to the sleeve 94. The valve spool 92 is moved to a downward movement end (hereinafter referred to as a "positive pressure application position"), which is indicated by a solid line in FIG. 8 to apply a positive pressure to the sleeve 94. The negative pressure or the positive pressure applied to the sleeves 94 is applied to the corresponding pickup nozzles 56 through supply passages (not illustrated).

Here, the supply passages for applying a negative or positive pressure to the sleeves 94 and how a negative or positive pressure is applied in the mounting head 50 is described. As illustrated in FIG. 6, the sleeves 94 each include a negative pressure inlet port 94A through which a negative pressure comes in, a positive pressure inlet port 94B through which a positive pressure comes in, and an outlet port (not illustrated) through which the negative or positive pressure came in through the negative pressure inlet port 94A or the positive pressure inlet port 94B leaves. The outlet ports are in communication with the corresponding pickup nozzles 56.

The inner shaft 62 has a first negative pressure supply passage 62A therein to which a negative pressure is applied. A first positive pressure supply passage 62B to which the positive pressure is applied is provided outside the rotary body 60 (see FIG. 2). In addition, a plurality of second negative pressure supply passages 64A into which a negative pressure is applied are provided in the shaft retainer 64 at positions corresponding to the sleeves 94. Furthermore, two second positive pressure supply passages 65A in communication with the first positive pressure supply passage 62B are provided in an outer ring member 65, which is disposed outwardly of the shaft retainer 64, such that a positive pressure is applied thereto.

The first negative pressure supply passage 62A is always in communication with all the second negative pressure supply passages 64A at the lower end, regardless of the rotation of the shaft 62. Furthermore, when the valve spools 92 are positioned at the negative pressure application position, the second negative pressure supply passages 64A are in communication with the corresponding negative pressure inlet ports 94A of the sleeves 94 housing the valve spools 92. When the valve spools 92 are positioned at the negative pressure application position, a negative pressure is constantly applied to the pickup nozzles 56 corresponding to the valve spools 92 (the switching devices 90), regardless whether the pickup nozzles 56 are circling about the axis of the rotary body 60.

The two second positive pressure supply passages 65A are provided in the outer ring member 65, which is disposed outwardly of the shaft retainer 64, at positions corresponding to the predetermined positions where the nozzle shafts 55 are moved up or down in the Z-axis direction by the Z-axis drive units 80. While the valve spools 92 corresponding to the pickup nozzles 56 at the predetermined positions are each located at the positive pressure application position, the second positive pressure supply passages 65A are in communication with the positive pressure inlet ports 94B of the sleeves 94 housing the valve spools 92. Thus, with the valve spools 92 being located at the positive pressure application position, a positive pressure is applied to the pickup nozzles 56 through the outlet ports only when the pickup nozzles 56 corresponding to the valve spools 92 are positioned at the predetermined position.

In the mounting head 50, as described above, a negative pressure is constantly applied to the pickup nozzle 56 corresponding to the valve spool 92 located at the negative pressure application position. Thus, the electronic component E1 held by the pickup nozzle 56 by suction is less likely to drop during movement of the mounting head 50, for example. Furthermore, as described above, a positive pressure is applied to the pickup nozzle 56 corresponding to the valve spool 92 located at the positive pressure application position only in a predetermined case. Thus, only the target electronic component E1 is mounted on the printed substrate B1 by using the positive pressure.

Figure 8:
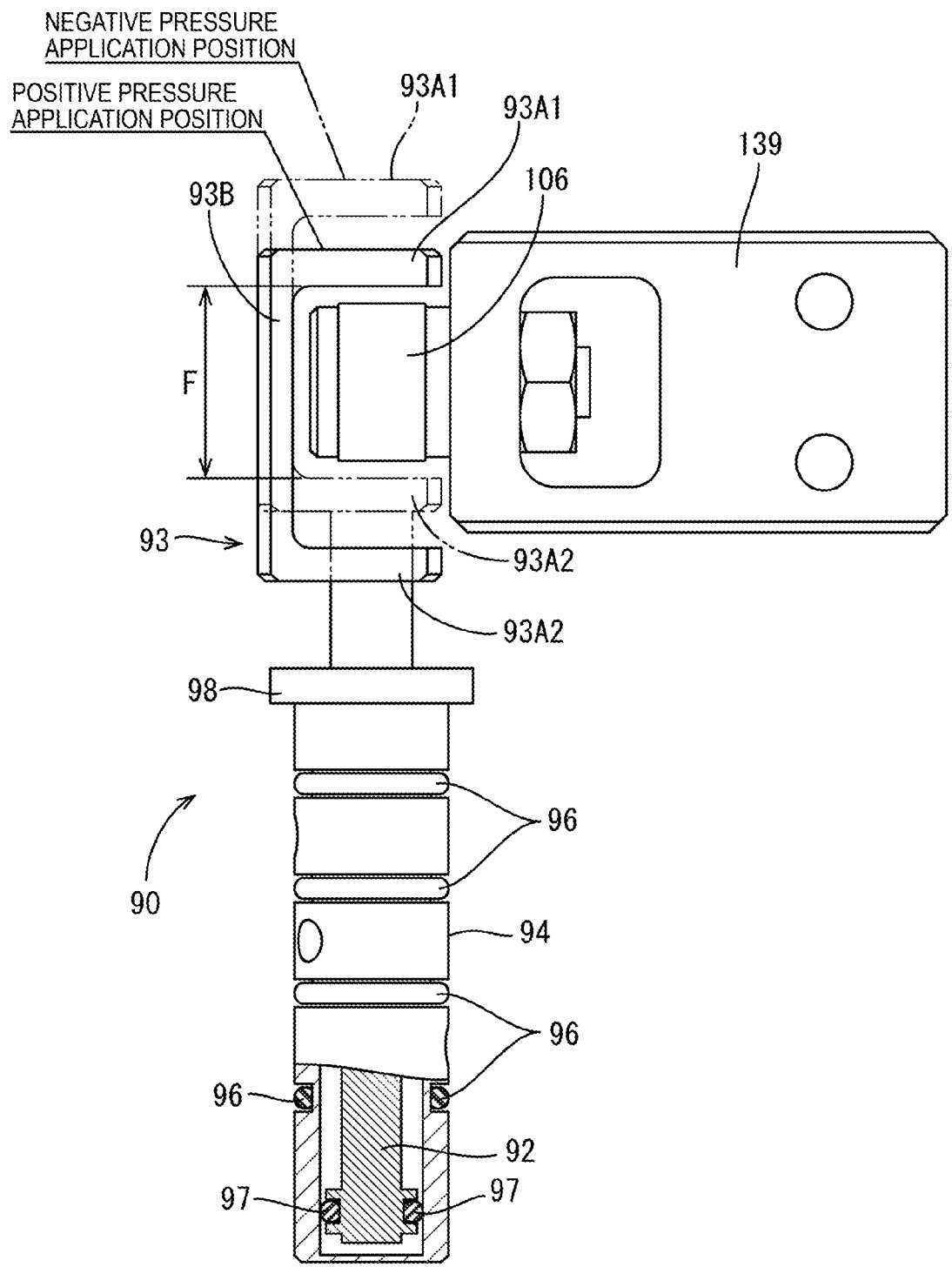
FIG. 8 is a front view illustrating how the valve spool moves.

As illustrated in FIG. 8, outer sealing members 96 are disposed on the outer surface of each sleeve 94 with a space therebetween in the Z-axis direction. The outer sealing members 96 are circular rings formed of an elastic material such as rubber and are configured to seal the mounting hole of the shaft retainer 64. In addition, inner sealing members 97 are arranged in the axial direction on the inner surface of the sleeve 94 (only one of the inner sealing members 97 at the lower position is indicated in FIG. 8). The inner sealing member 97 is a circular ring formed of an elastic material such as rubber and is attached to the outer surface of the valve spool 92 as illustrated in FIG. 8. The inner sealing members 97 seal between the inner surface of the sleeve 94 and the valve spool 92. This reduces the negative pressure leakage or the positive pressure leakage at the negative pressure inlet port 94A, the positive pressure inlet port 94B, and the outlet port. Furthermore, the inner sealing members 97 keep the valve spools 92 that has been moved to the negative pressure application position or the positive pressure application position at that position by the friction force.

As illustrated in FIG. 2 to FIG. 4, the mounting head 50 includes two V-axis drive units (one example of a drive unit) 100 configured to move the valve spool 92 of each switching device 90 between the negative pressure application position and the positive pressure application position in the Z-axis direction (the up-down direction). The two V-axis drive units 100 are disposed at positions corresponding to the two Z-axis drive units 80 in the Z-axis direction (see FIG. 5) and configured to move the valve spools 92 of the switching devices 90 corresponding to the pickup nozzles 56 at the predetermined positions. Thus, the two V-axis drive units 100 are also symmetrically arranged with the shaft 62 of the rotary body 60 therebetween at the left and right sides of the mounting head 50 as the two Z-axis drive units 80.

As illustrated in FIG. 3 to FIG. 5, FIG. 9, and FIG. 10, the V-axis drive units 100 each include a V-axis drive source (one example of a drive source) 102 having a box-like shape and a V-axis movable portion (one example of a movable portion) 104 configured to move in the Z-axis direction (the up-down direction) by using power from the V-axis drive source 102. The V-axis drive source 102 includes a V-axis linear motor 35V (see FIG. 7) for driving the V-axis movable portion 104 by a linear motor.

As illustrated in FIG. 4 and FIG. 5, a cam follower 106 (hereinafter, referred to as a "V-axis cam follower 106") is attached to the V-axis movable portion 104 in a rotatable manner about the axis extending in the X-axis direction with a cam follower supporting portion 139 disposed therebetween. When the V-axis drive unit 100 is energized, the V-axis movable portion 104 positions the V-axis cam follower (one example of a pin) 106 at a position between the opposing portions 93A of the valve spool 92 corresponding to the nozzle shaft 55 located at the predetermined position (see FIG. 5).

When the V-axis movable portion 104 is moved up by the V-axis drive source 102, the V-axis cam follower 106 comes in contact with the upper one of the two opposing portions 93A on the both sides of the V-axis cam follower 106 and moves up the valve spool 92 to the negative pressure application position. When the V-axis movable portion 104 is moved down by the V-axis drive source 102, the V-axis cam follower 106 comes in contact with the lower one of the two opposing portions 93A on the both sides of the V-axis cam follower 106 and moves down the valve spool 92 to the positive pressure application position. A drive mechanism of the V-axis drive unit 100 driven by a linear motor is described in detail later.

Since the rotation axis of the V-axis cam follower 106 extends in the X-axis direction, the rotation direction of the V-axis cam follower 106 is substantially the same as the tangential direction of the circular trajectory of the nozzle shafts 55 circled by the rotary body 60. Thus, when the rotary body 60 is rotated while the valve spool 92 is moved up or down by the V-axis cam follower 106, the V-axis cam follower 106 is rotated by a frictional force generated between the V-axis cam follower 106 and the opposing portion 93A while being in contact with the opposing portion 93A. Thus, the valve spool 92 is able to be moved up or down with the nozzle shafts 55 being kept circled.

The V-axis cam follower 106 does not come in contact with the opposing portions 93A when the valve spool 92 is positioned at the substantially middle between the negative pressure application position and the positive pressure application position. Thus, when the V-axis movable portion 104 is held such that the V axis-cam follower 106 is located at a position between the negative pressure application position and the positive pressure application position of the valve spool 92, the V-axis cam follower 106 does not come in contact with the valve spool 92, allowing the rotary body 60 to rotate.

Figure 7:
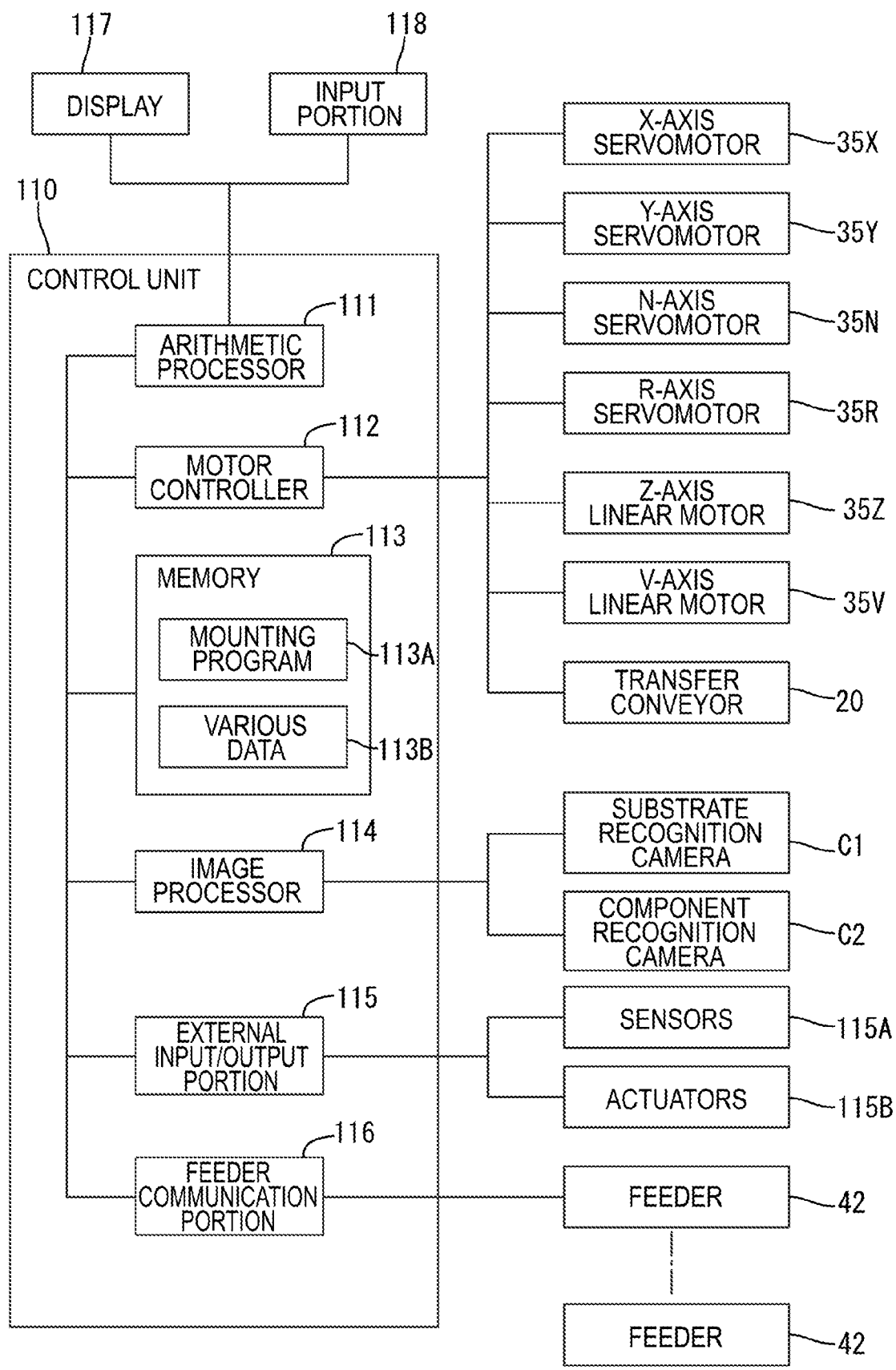
FIG. 7 is a block diagram indicating an electrical configuration of the surface mounter.

Furthermore, the mounting head 50 is provided with a substrate recognition camera C1 (see FIG. 7). The substrate recognition camera C1 is configured to move together with the mounting head 50 and capture an image of a predetermined portion of the printed substrate B1 stopped at the operation position. In addition, component recognition cameras C2 (see FIG. 1) are fixed to the base 10 at positions near the operation position. The component recognition cameras C2 are configured to capture an image of the electronic component E1 held by the pickup nozzle 56 by suction at the component feeding position of the component feeding device 40.

(Electrical Configuration of Surface Mounter)

Next, an electrical configuration of the surface mounter 1 is described with reference to FIG. 7. The entire of the surface mounter 1 is controlled by a control unit 110. The control unit 110 includes an arithmetic and control unit 111 such as a CPU. A motor controller 112, a memory 113, an image processor 114, an external input/output portion 115, a feeder communication portion 116, a display 117, and an input portion 118 are connected to the arithmetic and control unit 111.

The motor controller 112 is configured to drive the X-axis servomotor 35X and the Y-axis servomotor 35Y of the component mounting device 30 in accordance with a mounting program 113A, which will be described later, and drive the N-axis servomotor 35N, the R-axis servomotor 35R, the Z-axis linear motor 35Z, and the V-axis linear motor 35V of the mounting head 50. In addition, the motor controller 112 is configured to drive the transfer conveyor 20 in accordance with the mounting program 113A.

The memory 113 includes a Read Only Memory (ROM), which is configured to store programs or the like for controlling the CPU and a Random-Access Memory (RAM), which is configured to temporally store various data during the operation. The memory 113 stores the mounting program 113A, which will be described later, and various data 113B.

Specifically described, the mounting program 113A stored in the memory 113 includes substrate information relating to the production number of printed substrates B1, which are mounting targets, component information relating to the number or type of electronic components E1 to be mounted on the printed substrate B1, and mounting information relating to a mounting position of the electronic component E1 on the printed substrate B1, for example. The various data 113B stored in the memory 113 include data relating to the number or type of the electronic components E1 held by the feeders 42 of the component feeding device 40.

The image processor 114 is configured to receive imaging signals output from the substrate recognition camera C1 and the component recognition camera C2. The image processor 114 is configured to analyze the image of the component and the image of the substrate by using the imaging signals provided by the cameras C1 and C2.

The external input/output portion 115 is an interface and is configured to receive detection signals from various sensors 115A provided in the body of the surface mounter 1. In addition, the external input/output portion 115 is configured to control the operation of actuators 115B by using control signals output from the arithmetic processor 111.

The feeder communication portion 116 is connected to the controller of each feeder 42 of the component feeding device 40 to collectively control the feeders 42. The controller of each feeder 42 is configured to control the motor for sending out the component feeding tape.

The display 117 is a liquid crystal display device having a display screen, for example, and is configured to display the state of the surface mounter 1 on the display screen. The input portion 118 is a key board, for example, and is configured to receive external manual input.

The surface mounter 1 having the above-described configuration alternately performs a transferring operation in which the printed substrate B1 is transferred by the transfer conveyor 20 and a mounting operation in which the electronic component E1 transferred to the operation position of the base 10 is mounted on the print substrate B1.

(Drive Mechanism in V-Axis Drive Unit by Linear Motor)

Figure 9:
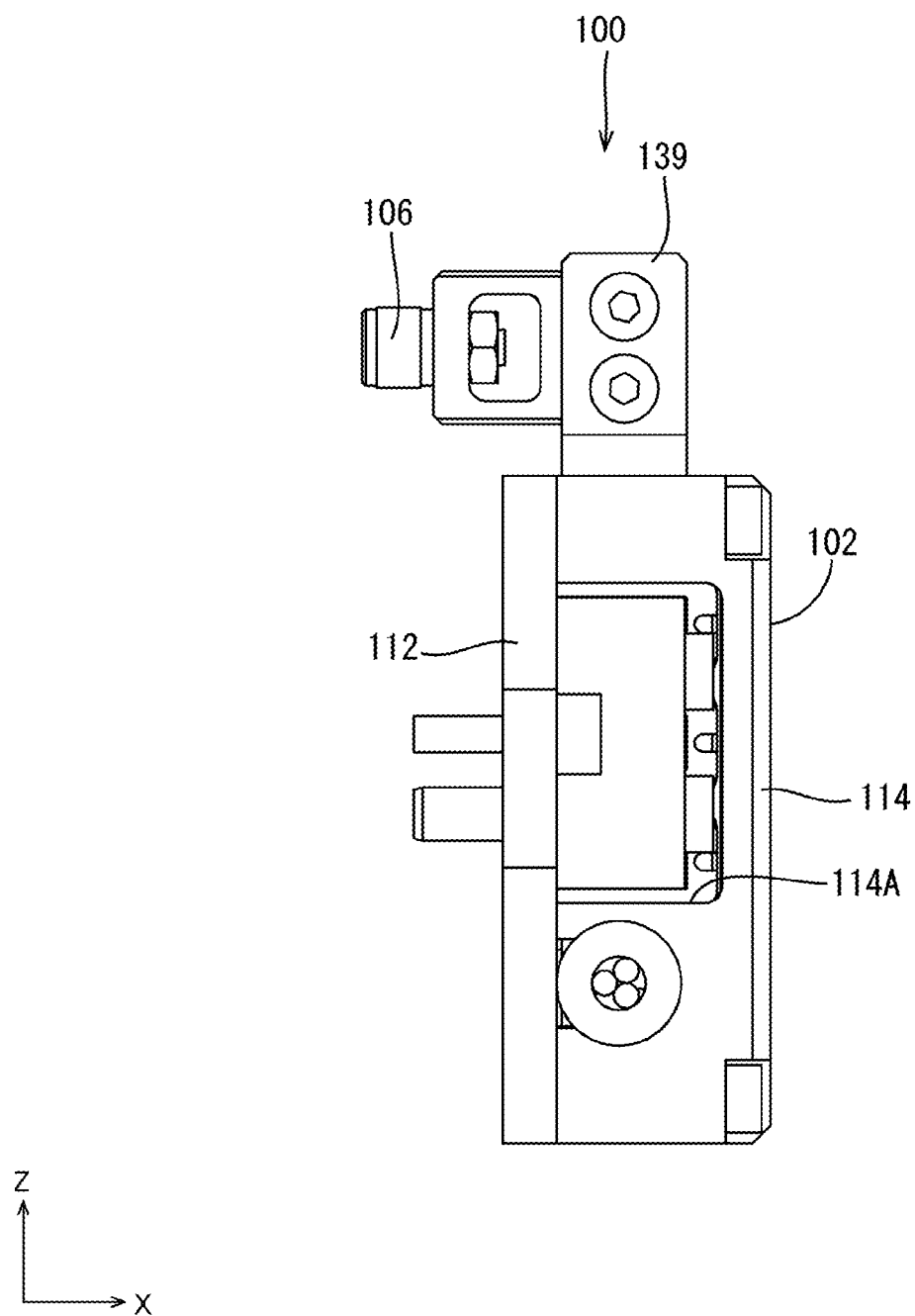
FIG. 9 is a front view of a V-axis drive unit.

Next, a drive mechanism in the V-axis drive unit 100 by a linear motor is described with reference to FIG. 9 and FIG. 10. As illustrated in FIG. 9, the box-like V-axis drive source 102 includes a planar V-axis body 112 having a drive mechanism driven by a linear motor and a V-axis cover 114 attached to the V-axis body 112 to protect the drive mechanism from the outside. The V-axis cover 114 does not fully cover the V-axis body 112. The V-axis cover 114 includes a cooling opening 114A at the front to prevent heat from staying inside the V-axis drive source 102.

In the V-axis drive unit 100, the V-axis drive source 102 includes a stator 120 of the linear motor and the V-axis movable portion 104 includes a mover 130 of the linear motor. As illustrated in FIG. 10, in the V-axis drive source 102, the stator 120, a rail 124, and an iron piece 126 (one example of the magnetic body) are disposed on the planar surface of the V-axis body 112. The stator 120 includes three armature coils 122 arranged in a movement direction of the V-axis movable portion 104 (the Z-axis direction, the up-down direction). The rail 124 extends in the movement direction of the V-axis movable portion 104.

The stator 120 is disposed at the front side (the left side in FIG. 10) of the V-axis drive source 102. The rail 124 is disposed on the rear side of the V-axis movable portion 104 (the right side in FIG. 10) such that the V-axis movable portion 104 is positioned between the rail 124 and the stator 120. The rail 124 has an inner rail groove (not illustrated) extending in the extending direction of the rail 124. The iron piece 126 is disposed below the stator 120 with a predetermined distance therebetween. The iron piece 126 is bolted to the V-axis body 112. The position of the iron piece 126 in the Z-axis direction and the Y-axis direction is adjusted by loosening the blot.

Figure 10:
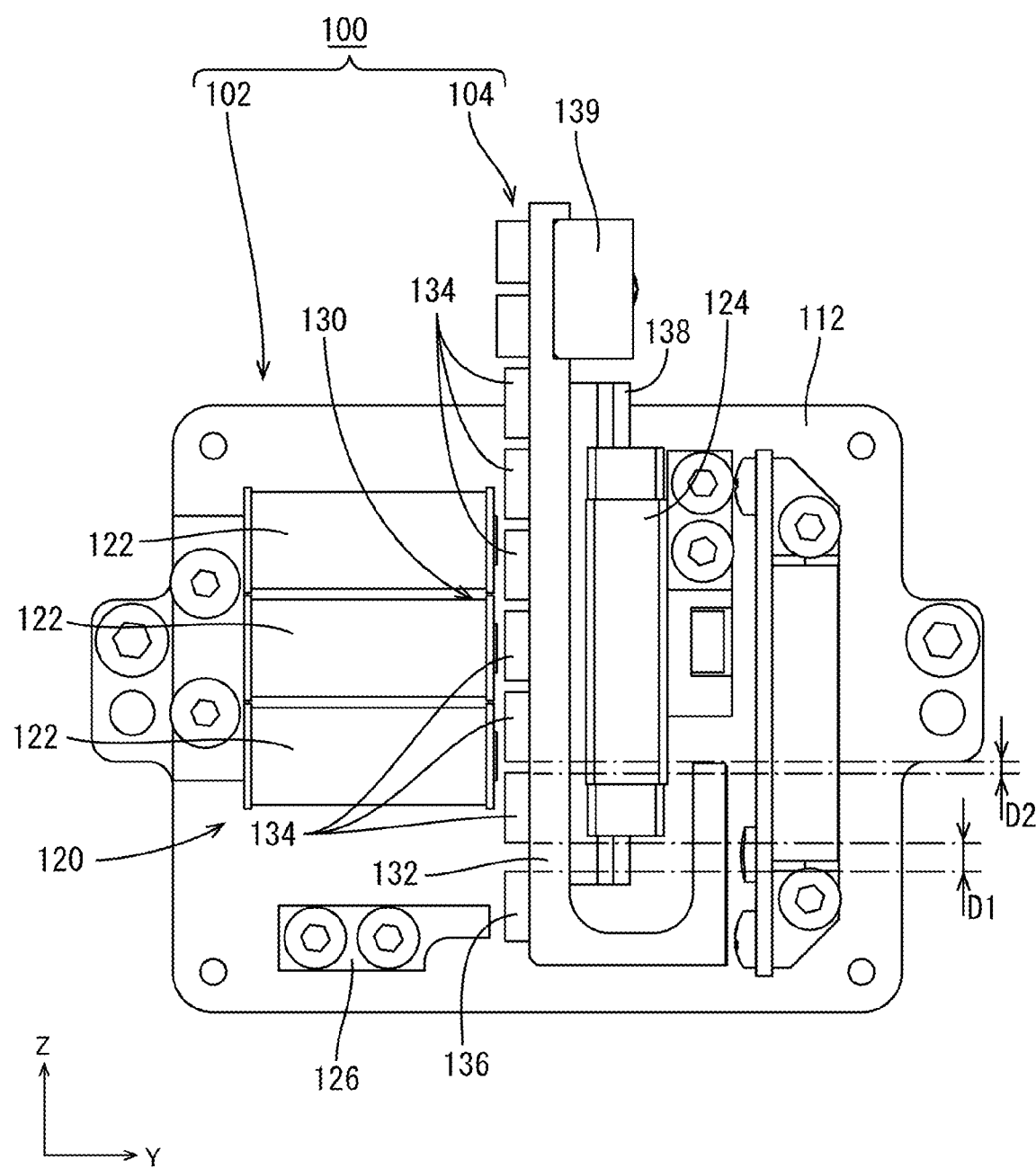
FIG. 10 is a side view illustrating the inside of the V-axis drive unit.

As illustrated in FIG. 10, the V-axis movable portion 104 includes a yoke 132 having a thick planar shape extending in the movement direction of the V-axis movable portion 104 with planar surfaces facing the front-back direction, the mover 130 including a plurality of permanent magnets 134 and disposed on the front surface of the yoke 132, a position retaining magnet 136 including one permanent magnet and disposed on the front surface of the yoke 132, a rail guide 138 disposed on the rear surface of the yoke 132, and the cam follower supporting portion 139 attached to the upper end portion of the yoke 132. The iron piece 126 and the position retaining magnet 136 constitute one example of the position retainer.

The yoke 132 has a lower end portion bent rearward. The end of the lower end portion extends to a rear side of the lower end portion of the rail 124. The permanent magnets 134 included in the mover 130 are arranged in a straight line at an equal interval such that different magnetic poles are adjacent to each other. The position retaining magnet 136 is disposed on the front surface of the lower end portion of the yoke 132 at a position below the permanent magnets 134 included in the mover 130. The surfaces of the permanent magnets 134 and the surface of the position retaining magnet 136 are flush with each other.

The rail guide 138 has a groove-like shape extending in the extending direction of the yoke 132 and fitted to the rail 124 in a movable manner in the extending direction of the yoke 132 (the movement direction of the V-axis movable portion 104, the Z-axis direction, the up-down direction). The cam follower supporting portion 139 is disposed on the upper end portion of the yoke 132 and supports the V-axis cam follower 106 in a rotatable manner. When the yoke 132 moves, the cam follower supporting portion 139 and the V-axis cam follower 106 move together with the yoke 132.

In the V-axis drive unit 100, the permanent magnets 134 and the stator 120 are located close to each other, and the position retaining magnet 136 and the iron piece 126 are located close to each other. In such a state, the rail 124 of the V-axis movable portion 104 is fitted to the rail guide 138. The distance between the permanent magnets 134 and the stator 120 and the distance between the position retaining magnet 136 and the iron piece 126 are substantially the same. Meanwhile, as illustrated in FIG. 10, a distance D1 between the position retaining magnet 136 and the permanent magnet 134 included in the mover 130 is larger than a distance D2 between the permanent magnets 134 included in the mover 130. The distance D1 is a distance between one of the permanent magnets 134 that is closest to the position retaining magnet 136 (the permanent magnet 134 at the lower end in FIG. 10) and the position retaining magnet 136.

In the V-axis drive unit 100, since the V-axis drive source 102 and the V-axis movable portion 104 have the above-described configurations, when a current is applied to the armature coils 122 of the stator 120, a driving force of a linear motor for moving the V-axis movable portion 104 in the Z-axis direction (the up-down direction) is generated between the stator 120 and the mover 130. The stator 120 and the mover 130, which generate the driving force, constitute a V-axis linear motor 35V that is controlled by the controller 110.

In the V-axis drive unit 100, the position retaining magnet 136 and the iron piece 126 constitute a magnetic spring. When the current supply to the armature coils 122 is stopped (when the V-axis drive source 102 is stopped), the position retaining magnet 136 is drawn toward the front of the iron piece 126 by a magnetic attractive force of the magnetic spring. Thus, the magnetic spring (the position retaining magnet 136, the iron piece 126) holds the V-axis movable portion 104 at a non-contact position where the V-axis movable portion 104 does not come in contact with the valve spool 92 located at any of the negative pressure application position and the positive pressure application position.

More specifically described, the V-axis movable portion 104 is held by the magnetic spring (the position retaining magnet 136, the iron piece 126) such that the V-axis cam follower 106 of the V-axis movable portion 104 is located in an F region indicated in FIG. 8, i.e., at a position between an upper opposing portion 93A1 of the valve spool 92 located at the positive pressure application position and a lower opposing portion 93A2 of the valve spool 92 located at the negative pressure application position. In FIG. 8, the upper opposing portion has the reference numeral 93A1 and the lower opposing portion has the reference numeral 93A2 to distinguish the upper and lower opposing portions 93A.

The magnetic force of the permanent magnets 134 included in the mover 130 is larger than that of the position retaining magnet 136. Thus, the movement of the V-axis drive source 102 by a linear motor is not affected by the position retaining magnet 136.

In the mounting head 50 according to the embodiment, the magnetic spring including the position retaining magnet 136 and the iron piece 126 is configured to hold the V-axis movable portion 104 at a non-contact position where the V-axis movable portion 104 is not in contact with the valve spool 92 located at any of the negative pressure application position and the positive pressure application position. More specifically, the magnetic spring holds the V-axis movable portion 104 at a position where the V-axis cam follower 106 is not in contact with the opposing portion 93A of the valve spool 92 located at any of the negative pressure application position and the positive pressure application position.

With this configuration, when the devices, such as the V-axis drive unit 100, are powered off and the rotary body 60 of the mounting head 50 is rotated for maintenance of the mounting head 50, the V-axis cam follower 106 does not come in contact with the opposing portion 93A of the valve spool 92 located at any of the negative pressure position and the positive pressure position. The maintenance properties of the mounting head 50 are improved.

Furthermore, in the mounting head 50, the magnetic spring including the position retaining magnet 136 and the iron piece 126 holds the V-axis movable portion 104 at a position where the V-axis movable portion 104 does not come in contact with the valve spool 92 located at any of the negative pressure application position and the positive pressure application position. With this configuration, if the mounting head 50 is stopped suddenly by being powered off, for example, with the pickup nozzle 56 holding a component, the V-axis cam follower 106 does not push down the lower opposing portion 93A2 at the negative pressure application position to switch the position of the valve spool 92 from the negative pressure application position to the positive pressure application position. Thus, the component is less likely to drop from the pickup nozzle 56. This improves device reliability.

The V-axis cam follower 106 is preferably held at a middle position between the upper opposing portion 93A1 of the valve spool 92 located at the positive pressure application position and the lower opposing portion 93A2 of the valve spool 92 located at the negative pressure application position. This hardly allow the V-axis cam follower 106 to come in contact with the opposing portion 93A of the valve spool 92 located at any of the negative pressure application position and the positive pressure application position.

In the mounting head 50 of the embodiment, the position retainer for holding the V-axis movable portion 104 in a predetermined position is composed of a magnetic spring. For example, if the position retainer is composed of a spiral spring, such as a coil spring, it would be difficult to adjust the retaining position of a V-axis movable portion 104. In addition, since the elasticity of the spiral spring deteriorates, the retaining force may be lowered. The magnetic spring is able to adjust the retaining position of the V-axis movable portion 104) (the retaining position in the Z-axis direction) by adjustment of the location of the iron piece 126. Thus, the magnetic spring is able to hold the V-axis movable portion 104 with high positional accuracy. In addition, the magnetic spring is less likely to deteriorate and has high durability.

Furthermore, as described above, in the mounting head 50 of the embodiment, the distance D1 between the position retaining magnet 136 and the permanent magnets 134 included in the mover 130 is larger than the distance D2 between the permanent magnets 134 included in the mover 130. With this configuration, the iron piece 126 is less likely to affect the permanent magnets 134 included in the mover 130, compared with the configuration in which the distance D1 is smaller than the distance D2 or the distance D1 is equal to the distance D2. Thus, the permanent magnets 134 included in the mover 130 are less likely to be drawn to the iron piece 126. This enables the V-axis movable portion 104 to be held in a predetermined position by the magnetic spring and the V-axis movable portion to be reliably driven by a linear motor.

Other Embodiments

The technology disclosed herein is not limited to the embodiments described above and illustrated by the drawings. For example, the following embodiments will be included in the technical scope of the present disclosure.

(1) In the example of the above-described embodiment, a magnetic spring including the position retaining magnet 136 and the iron piece 126 is used as one example of the position retainer configured to hold the V-axis movable portion 104 in a predetermined position. However, the V-axis movable portion 104 may be held in a predetermined position by a spiral spring attached to a surface of the V-axis body 112.

(2) In the example of the above-described embodiment, the magnetic spring is composed of the iron piece 126 and the position retaining magnet 136, but the magnetic body is not limited to the iron piece 126 and other magnetic bodies than the iron piece 126 may be employed.

(3) In the example of the above-described embodiment, the iron piece 126 and the position retaining magnet 136 constituting the position retainer are located below the stator 120 and the mover 130, but the positions of the iron piece 126 and the position retaining magnet 136 are not limited to this example. The iron piece 126 and the position retaining magnet 136 may be positioned at any position that enables the V-axis movable portion 104 to be held in a predetermined position while the V-axis drive source 102 is being powered off.

(4) In the example of the above-described embodiment, the mounting head 50 is a rotary type mounting head. However, the mounting head 50 may be an in-line type mounting head having the nozzle shafts 55 arranged in a straight line. In such a case, the valve spools 92 are arranged so as to correspond to the nozzle shafts 55, and the valve spool 92 at a predetermined position may be moved in the axial direction.

(5) In the example of the above-described embodiment, the V-axis cam follower 106 comes in contact with the opposing portions 93A of the valve spool 92 to move the valve spool 92 in the axial direction thereof. However, a component to come in contact with the valve spool 92 is not limited to the cam follower 106, and may be a fixed pin that does not rotate, for example.

(6) In the example of the above-described embodiment, the V-axis cam follower 106 is held at a middle in height between the negative pressure application position and the positive pressure application position of the valve spool 92. However, the V-axis cam follower 106 may be held at a position around the middle in height and may be held at a position slightly away from the middle.

(7) In the example of the above-described embodiment, the surface mounter 1 including the mounting head 50 is described. However, the mounting head 50 described in the embodiment may be employed in an apparatus other than the surface mounter.

The embodiment is described above in detail, but the description is merely an example and does not limit the scope of claims. The technology in the scope of the claims includes modifications and changes, which may be added to the above-described specific examples.

What is claimed is:

1. A mounting head, comprising:
   a pickup nozzle configured to hold a component by suction at a front end thereof by a negative pressure and release the component held at the front end by a positive pressure;
   a shaft member having a cylindrical shape and configured to move in an axial direction thereof to switch a pressure applied to the pickup nozzle between the negative pressure and the positive pressure, a first movement end in the axial direction being a negative pressure application position where the negative pressure is applied to the pickup nozzle, a second movement end in the axial direction being a positive pressure application position where the positive pressure is applied to the pickup nozzle;
   a driver including a drive source and a movable portion configured to move in the axial direction by using power supplied from the drive source, the movable portion being configured to come in contact with the shaft member at a portion thereof when moved in the axial direction, to allow the shaft member to move between the negative pressure application position and the positive pressure application position; and
   a position retainer configured to hold the movable portion in a predetermined position during a power-off period of the drive source such that the movable portion is away from the shaft member located at any of the negative pressure application position and the positive pressure application position.

2. The mounting head according to claim 1, wherein:
   the movable portion includes a pin configured to come in contact with a contact portion of the shaft member, and
   the position retainer holds the movable portion such that the pin is positioned between the contact portion of the shaft member located at the negative pressure application position and the contact portion of the shaft member located at the positive pressure application position.

3. The mounting head according to claim 2, wherein the position retainer comprises a magnetic spring including a magnetic body and a magnet.

4. The mounting head according to claim 3, wherein:
   the driver includes a stator, the movable portion includes a mover, and the movable portion is moved by a linear motor including the stator and the mover,
   the mover includes a plurality of magnets arranged in a straight line at an equal interval, and
   a distance between the magnets included in the position retainer and the magnet included in the mover is larger than a distance between the magnets included in the mover.

5. The mounting head according to claim 1, wherein the position retainer comprises a magnetic spring including a magnetic body and a magnet.

6. The mounting head according to claim 5, wherein:
   the driver includes a stator, the movable portion includes a mover, and the movable portion is moved by a linear motor including the stator and the mover,
   the mover includes a plurality of magnets arranged in a straight line at an equal interval, and
   a distance between the magnets included in the position retainer and the magnet included in the mover is larger than a distance between the magnets included in the mover.

7. A surface mounter comprising:
   a component mounter including a mounting head configured to mount a component on a substrate, the mounting head comprising:
   a pickup nozzle configured to hold the component by suction at a front end thereof by a negative pressure and release the component held at the front end by a positive pressure;
   a shaft member having a cylindrical shape and configured to move in an axial direction thereof to switch a pressure applied to the pickup nozzle between the negative pressure and the positive pressure, a first movement end in the axial direction being a negative pressure application position where the negative pressure is applied to the pickup nozzle, a second movement end in the axial direction being a positive pressure application position where the positive pressure is applied to the pickup nozzle;

a driver including a drive source and a movable portion configured to move in the axial direction by using power supplied from the drive source, the movable portion being configured to come in contact with the shaft member at a portion thereof when moved in the axial direction, to allow the shaft member to move between the negative pressure application position and the positive pressure application position; and a position retainer configured to hold the movable portion in a predetermined position during a power-off period of the drive source such that the movable portion is away from the shaft member located at any of the negative pressure application position and the positive pressure application position;

a component feeder configured to feed the component to the component mounter; and a substrate transporter configured to transfer the substrate to a mounting region where the component is mounted by the component mounter.

8. A surface mounter comprising:

a component mounter including a mounting head configured to mount a component on a substrate, the mounting head comprising:

a pickup nozzle configured to hold the component by suction at a front end thereof by a negative pressure and release the component held at the front end by a positive pressure;

a shaft member having a cylindrical shape and configured to move in an axial direction thereof to switch a pressure applied to the pickup nozzle between the negative pressure and the positive pressure, a first movement end in the axial direction being a negative pressure application position where the negative pressure is applied to the pickup nozzle, a second movement end in the axial direction being a positive pressure application position where the positive pressure is applied to the pickup nozzle;

a driver including a drive source and a movable portion configured to move in the axial direction by using power supplied from the drive source, the movable portion being configured to come in contact with the shaft member at a portion thereof when moved in the axial direction, to allow the shaft member to move between the negative pressure application position and the positive pressure application position; and a position retainer configured to hold the movable portion in a predetermined position during a power-off period of the drive source such that the movable portion is away from the shaft member located at any of the negative pressure application position and the positive pressure application position, wherein the movable portion includes a pin configured to come in contact with a contact portion of the shaft member, and the position retainer holds the movable portion such that the pin is positioned between the contact portion of the shaft member located at the negative pressure application position and the contact portion of the shaft member located at the positive pressure application position;

a component feeder configured to feed the component to the component mounter; and a substrate transporter configured to transfer the substrate to a mounting region where the component is mounted by the component mounter.

9. A surface mounter comprising:

a component mounter including a mounting head configured to mount a component on a substrate, the mounting head comprising:

a pickup nozzle configured to hold the component by suction at a front end thereof by a negative pressure and release the component held at the front end by a positive pressure;

a shaft member having a cylindrical shape and configured to move in an axial direction thereof to switch a pressure applied to the pickup nozzle between the negative pressure and the positive pressure, a first movement end in the axial direction being a negative pressure application position where the negative pressure is applied to the pickup nozzle, a second movement end in the axial direction being a positive pressure application position where the positive pressure is applied to the pickup nozzle;

a driver including a drive source and a movable portion configured to move in the axial direction by using power supplied from the drive source, the movable portion being configured to come in contact with the shaft member at a portion thereof when moved in the axial direction, to allow the shaft member to move between the negative pressure application position and the positive pressure application position; and a position retainer configured to hold the movable portion in a predetermined position during a power-off period of the drive source such that the movable portion is away from the shaft member located at any of the negative pressure application position and the positive pressure application position, the position retainer comprising a magnetic spring including a magnetic body and a magnet;

a component feeder configured to feed the component to the component mounter; and a substrate transporter configured to transfer the substrate to a mounting region where the component is mounted by the component mounter.

10. A surface mounter comprising:

a component mounter including a mounting head configured to mount a component on a substrate, the mounting head comprising:

a pickup nozzle configured to hold the component by suction at a front end thereof by a negative pressure and release the component held at the front end by a positive pressure;

a shaft member having a cylindrical shape and configured to move in an axial direction thereof to switch a pressure applied to the pickup nozzle between the negative pressure and the positive pressure, a first movement end in the axial direction being a negative pressure application position where the negative pressure is applied to the pickup nozzle, a second movement end in the axial direction being a positive pressure application position where the positive pressure is applied to the pickup nozzle;

a driver including a drive source and a movable portion configured to move in the axial direction by using power supplied from the drive source, the movable portion being configured to come in contact with the shaft member at a portion thereof when moved in the axial direction, to allow the shaft member to move between the negative pressure application position and the positive pressure application position; and a position retainer configured to hold the movable portion in a predetermined position during a power-off period of the drive source such that the movable portion is away from the shaft member located at any of the negative pressure application position and the positive pressure application position, the position retainer comprising a magnetic spring including a magnetic body and a magnet, wherein the driver includes a stator, the movable portion includes a mover, and the movable portion is moved by a linear motor including the stator and the mover, the mover includes a plurality of magnets arranged in a straight line at an equal interval, and a distance between the magnets included in the position retainer and the magnet included in the mover is larger than a distance between the magnets included in the mover;

a component feeder configured to feed the component to the component mounter; and a substrate transporter configured to transfer the substrate to a mounting region where the component is mounted by the component mounter.

11. A surface mounter comprising:

a component mounter including a mounting head configured to mount a component on a substrate, the mounting head comprising:

a pickup nozzle configured to hold the component by suction at a front end thereof by a negative pressure and release the component held at the front end by a positive pressure;

a shaft member having a cylindrical shape and configured to move in an axial direction thereof to switch a pressure applied to the pickup nozzle between the negative pressure and the positive pressure, a first movement end in the axial direction being a negative pressure application position where the negative pressure is applied to the pickup nozzle, a second movement end in the axial direction being a positive pressure application position where the positive pressure is applied to the pickup nozzle;

a driver including a drive source and a movable portion configured to move in the axial direction by using power supplied from the drive source, the movable portion being configured to come in contact with the shaft member at a portion thereof when moved in the axial direction, to allow the shaft member to move between the negative pressure application position and the positive pressure application position; and a position retainer configured to hold the movable portion in a predetermined position during a power-off period of the drive source such that the movable portion is away from the shaft member located at any of the negative pressure application position and the positive pressure application position, wherein the movable portion includes a pin configured to come in contact with a contact portion of the shaft member, the position retainer holds the movable portion such that the pin is positioned between the contact portion of the shaft member located at the negative pressure application position and the contact portion of the shaft member located at the positive pressure application position, and the position retainer comprises a magnetic spring including a magnetic body and a magnet;

a component feeder configured to feed the component to the component mounter; and a substrate transporter configured to transfer the substrate to a mounting region where the component is mounted by the component mounter.

12. A surface mounter comprising:

a component mounter including a mounting head configured to mount a component on a substrate, the mounting head comprising:

a pickup nozzle configured to hold the component by suction at a front end thereof by a negative pressure and release the component held at the front end by a positive pressure;

a shaft member having a cylindrical shape and configured to move in an axial direction thereof to switch a pressure applied to the pickup nozzle between the negative pressure and the positive pressure, a first movement end in the axial direction being a negative pressure application position where the negative pressure is applied to the pickup nozzle, a second movement end in the axial direction being a positive pressure application position where the positive pressure is applied to the pickup nozzle;

a driver including a drive source and a movable portion configured to move in the axial direction by using power supplied from the drive source, the movable portion being configured to come in contact with the shaft member at a portion thereof when moved in the axial direction, to allow the shaft member to move between the negative pressure application position and the positive pressure application position; and a position retainer configured to hold the movable portion in a predetermined position during a power-off period of the drive source such that the movable portion is away from the shaft member located at any of the negative pressure application position and the positive pressure application position, wherein the movable portion includes a pin configured to come in contact with a contact portion of the shaft member, the position retainer holds the movable portion such that the pin is positioned between the contact portion of the shaft member located at the negative pressure application position and the contact portion of the shaft member located at the positive pressure application position, the position retainer comprises a magnetic spring including a magnetic body and a magnet, the driver includes a stator, the movable portion includes a mover, and the movable portion is moved by a linear motor including the stator and the mover, the mover includes a plurality of magnets arranged in a straight line at an equal interval, and a distance between the magnets included in the position retainer and the magnet included in the mover is larger than a distance between the magnets included in the mover;

a component feeder configured to feed the component to the component mounter; and a substrate transporter configured to transfer the substrate to a mounting region where the component is mounted by the component mounter.

* * * * *